United States Patent
Deshpande et al.

(10) Patent No.: US 7,480,527 B2
(45) Date of Patent: Jan. 20, 2009

(54) MAGNETIC RESONANCE IMAGING METHOD AND APPARATUS WITH NON-SELECTIVE EXCITATION OF THE EXAMINATION SUBJECT

(75) Inventors: Vibhas Deshpande, Los Angeles, CA (US); Gerhard Laub, Los Angeles, CA (US)

(73) Assignee: Siemens Aktiengesellschaft, Munich (DE)

( * ) Notice: Subject to any disclaimer, the term of this patent is extended or adjusted under 35 U.S.C. 154(b) by 53 days.

(21) Appl. No.: 11/354,727

(22) Filed: Feb. 15, 2006

(65) Prior Publication Data

US 2007/0191705 A1    Aug. 16, 2007

(51) Int. Cl.
*A61B 5/05* (2006.01)

(52) U.S. Cl. .................. 600/413; 600/411; 600/410

(58) Field of Classification Search .............. 600/413, 600/411, 410
See application file for complete search history.

(56) References Cited

U.S. PATENT DOCUMENTS

| 4,769,603 | A | | 9/1988 | Oppelt et al. | |
|---|---|---|---|---|---|
| 5,420,510 | A | * | 5/1995 | Fairbanks et al. | 324/309 |
| 6,094,591 | A | * | 7/2000 | Foltz et al. | 600/419 |
| 6,411,088 | B1 | | 6/2002 | Kuth et al. | |
| 6,462,545 | B1 | * | 10/2002 | Busse et al. | 324/309 |
| 6,518,759 | B2 | * | 2/2003 | Bernstein | 324/307 |
| 6,559,643 | B2 | * | 5/2003 | Miyoshi | 324/309 |
| 6,903,548 | B2 | * | 6/2005 | Foo | 324/306 |
| 7,020,509 | B2 | * | 3/2006 | Heid | 600/410 |
| 2002/0190714 | A1 | * | 12/2002 | Bernstein | 324/307 |
| 2004/0059213 | A1 | * | 3/2004 | Kassai et al. | 600/410 |
| 2005/0065429 | A1 | * | 3/2005 | Zhou | 600/412 |
| 2005/0182314 | A1 | * | 8/2005 | Wu et al. | 600/410 |
| 2006/0161060 | A1 | * | 7/2006 | Pai | 600/431 |
| 2007/0055138 | A1 | * | 3/2007 | Edelman | 600/411 |

OTHER PUBLICATIONS

Nits, W.R. "Fast and ultrafast non-echo-planar MR imaging techniques". Eur Radiol, (2002) 12:2866-2882.*
Shields, Thomas W. General Thoracic Surgery. 6th ed. vol. 2. New York: Lippincott Williams & Wilkins, 2004. 163.*

* cited by examiner

*Primary Examiner*—Eric F Winakur
*Assistant Examiner*—Helene Bor
(74) *Attorney, Agent, or Firm*—Schiff Hardin LLP

(57) ABSTRACT

In a magnetic resonance imaging apparatus and a method for operating the apparatus, a trueFISP sequence is used, but is modified to employ non-selective, rectangular radio frequency pulses. The use of non-selective excitation pulses reduces the sensitivity to off-resonance and allows excitation to be achieved in a shorter time compared to selective excitation, thereby shortening the time between echoes and minimizing slice profile issues.

18 Claims, 4 Drawing Sheets

MAGNETIC RESONANCE IMAGING METHOD AND APPARATUS WITH NON-SELECTIVE EXCITATION OF THE EXAMINATION SUBJECT

BACKGROUND OF THE INVENTION

1. Field of the Invention

The present invention is directed in general to magnetic resonance imaging (MRI) or magnetic resonance tomography (MRT), as employed in medicine for examining patients. The present invention is directed to a method as well as an apparatus for obtaining magnetic resonance images.

2. Description of the Prior Art

MRI/MRT is based on the physical phenomenon of nuclear magnetic resonance, and has been successfully employed in medicine and biophysics for almost two decades. In this examination modality, the examination subject (patient) is placed in a strong, constant magnetic field. The previously irregularly oriented nuclear spins in the subject are thereby aligned. Radio frequency energy then can excite these "ordered" spins to a specific oscillation. This oscillation generates the actual measured MR signal, which is picked up with suitable reception coils. By utilizing non-uniform magnetic fields, generated by gradient coils, the examination subject, and thus the MR signals emitted therefrom, can be spatially encoded in all three directions of a Cartesian coordinate system. In order to obtain data that are then processed to form the magnetic resonance image, a magnetic resonance imaging (tomography) apparatus is operated according to a sequence of radio frequency (RF) pulses and gradient pulses that are supplied to RF coils and gradient coils in a magnetic resonance scanner, in which the aforementioned strong, constant magnetic field is generated, and in which the patient is placed. Many such pulse sequences are known, and are generally designated with acronyms. One such known sequence is the FISP (fast imaging with steady precession) sequence. A version of the FISP sequence has been developed that is known as trueFISP, and is a promising tool for cardiovascular MRI, due to its inherently high blood signal and blood-myocardial contrast. In a trueFISP sequence, the magnetization in each repetition (TR) is recycled, thereby achieving a high blood signal-to-noise ratio and high blood-myocardial contrast-to-noise ratio.

Details of the known trueFISP sequence are available, for example, from U.S. Pat. Nos. 4,769,603 and 6,411,088.

A limitation of the trueFISP sequence is that is sensitive to off-resonance, which is directly proportional to the repetition time of the sequence. Another possible shortcoming may be due to imperfect excitation slice profiles that, when combined with blood flow, may cause image artifacts.

SUMMARY OF THE INVENTION

It is an object of the present invention to provide a magnetic resonance imaging method and apparatus operating according to a trueFISP sequence, but modified to avoid the aforementioned problems. The above object is achieved in accordance with the present invention in a method and apparatus for magnetic resonance imaging wherein a trueFISP sequence is used to generate the image data, but the sequence is modified by the use of non-selective radio frequency excitation of the examination subject. As used herein "non-selective excitation" means that the radio frequency pulses are not emitted in the presence of a slice-selection gradient, as is the case in a conventional trueFISP sequence. Moreover, rectangular RF excitation pulses are emitted. It has been found that non-selective, rectangular RF excitation can be achieved in a much shorter time than the conventional selective excitation, thereby resulting in a much shorter echo spacing, as well as minimal slice profile issues.

The trueFISP sequence, modified to employ non-selective, rectangular RF excitation, can be used to particular advantage in cardiac imaging wherein the data acquisition is triggered by an ECG signal. In accordance with the invention, after a delay following ECG triggering, such as R-wave triggering, $T_2$ preparation takes place, followed by navigator gating. Preparation pulses and data acquisition using the aforementioned sequence then take place, followed by the generation of spoiler gradient.

Optionally, fat suppression can be implemented following the navigator gating and preceding the data acquisition preparation.

DESCRIPTION OF THE PREFERRED EMBODIMENTS

Figure 1:
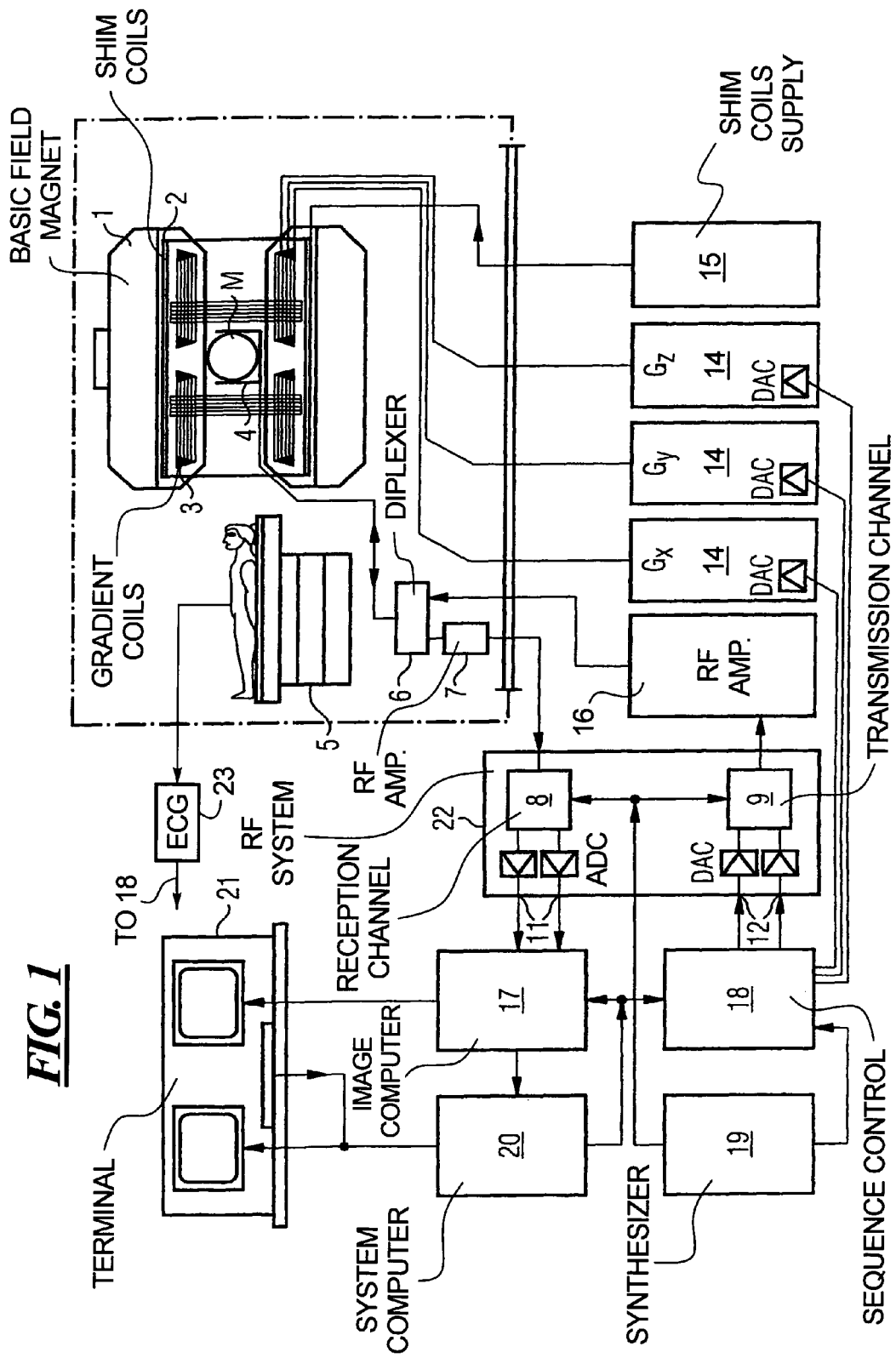
FIG. 1 is a schematic block diagram of a magnetic resonance imaging apparatus constructed and operating in accordance with the principles of the present invention.

FIG. 1 is a schematic illustration of a magnetic resonance tomography apparatus for generating gradient pulses according to the present invention. The structure of the magnetic resonance tomography apparatus corresponds to the structure of a conventional tomography apparatus, with the differences described below. A basic field magnet 1 generates a temporally constant, strong magnetic field for the polarization or alignment of the nuclear spins in the examination region of a subject such as, for example, a part of a human body to be examined. The high homogeneity of the basic magnetic field required for the magnetic resonance measurement is defined in a spherical measurement volume M into which the parts of the human body to be examined are introduced. For satisfying the homogeneity requirements and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with current by an amplifier 14 for generating a linear gradient field in the respective direction of the Cartesian coordinate system. The first sub-winding of the gradient field system generates a gradient $G_x$ in the x-direction, the second sub-winding generates a gradient $G_y$ in the y-direction and the third sub-winding generates a gradient $G_z$ in the x-direction. Each amplifier 14 has a digital-to-analog converter that is driven by a sequence controller 18 for the temporally correct generation of gradient pulses.

A radio frequency antenna 4 is situated within the gradient field system 3. This antenna 4 converts the radio frequency pulse output by a radio frequency power amplifier 30 into a magnetic alternating field for exciting the nuclei and alignment of the nuclear spins of the examination subject or of the region of the subject to be examined. The antenna 4 is schematically indicated in FIG. 1, and can be either a whole-body antenna or a local coil, or a combination of both. An appropriate local coil can be used, for example, to detect magnetic resonance signals in the region of the heart, for cardiac imaging and magnetic resonance angiography.

The radio frequency antenna 4 and the gradient coil system 3 are operated in a pulse sequence composed of one or more radio frequency pulses and one or more gradient pulses. The radio frequency antenna 4 converts the alternating field emanating from the processing nuclear spins, i.e. the nuclear spin echo signals, into a voltage that is supplied via an amplifier 7 to a radio frequency reception channel 8 of a radio frequency system 22. The radio frequency system 22 also has a transmission channel 9 in which the radio frequency pulses for exciting the nuclear magnetic resonance are generated. The respective radio frequency pulses are digitally represented as a sequence of complex numbers in the sequence controller 18 on the basis of a pulse sequence prescribed by the system computer 20. As a real part and an imaginary part, this number sequence is supplied via an input 12 to a digital-to-analog converter in the radio frequency system 22 and from the latter to a transmission channel 9. In the transmission channel 9, the pulse sequences are modulated onto a high-frequency carrier signal having a base frequency corresponding to the resonant frequency of the nuclear spins in the measurement volume.

The switching from transmission mode to reception mode ensues via a transmission-reception diplexer 6. The radio frequency antenna 4 emits the radio frequency pulses for exciting the nuclear spins into the measurement volume M and samples resulting echo signals. The correspondingly acquired nuclear magnetic resonance signals are phase-sensitively demodulated in the reception channel 8 of the radio frequency system 22 and converted via respective analog-to-digital converters into a real part and an imaginary part of the measured signal. An image computer 17 reconstructs an image from the measured data acquired in this way. The management of the measured data, of the image data and of the control programs ensues via the system computer 20. On the basis of control programs, the sequence controller 18 controls the generation of the desired pulse sequences and the corresponding sampling of k-space. In particular, the sequence controller 18 controls the temporally correct switching of the gradients, the emission of the radio frequency pulses with defined phase and amplitude as well as the reception of the magnetic resonance signals. The time base (clock) for the radio frequency system 22 and the sequence controller 18 is made available by a synthesizer 19. The selection of corresponding control programs for generating a magnetic resonance image as well as the presentation of the generated magnetic resonance image ensue via a terminal 21 that has a keyboard as well as one or more picture screens.

The apparatus shown in FIG. 1 operates in accordance with the present invention by virtue of an appropriate pulse sequence (protocol) being entered by an operator via the terminal 22 into the system computer 20 and the sequence control 18. In order to implement ECG triggering, an ECG signal is acquired from the subject in a known manner by an ECG unit 23, and this signal is supplied, for example, to the sequence control 18 (or to the system computer 20).

Figure 2:
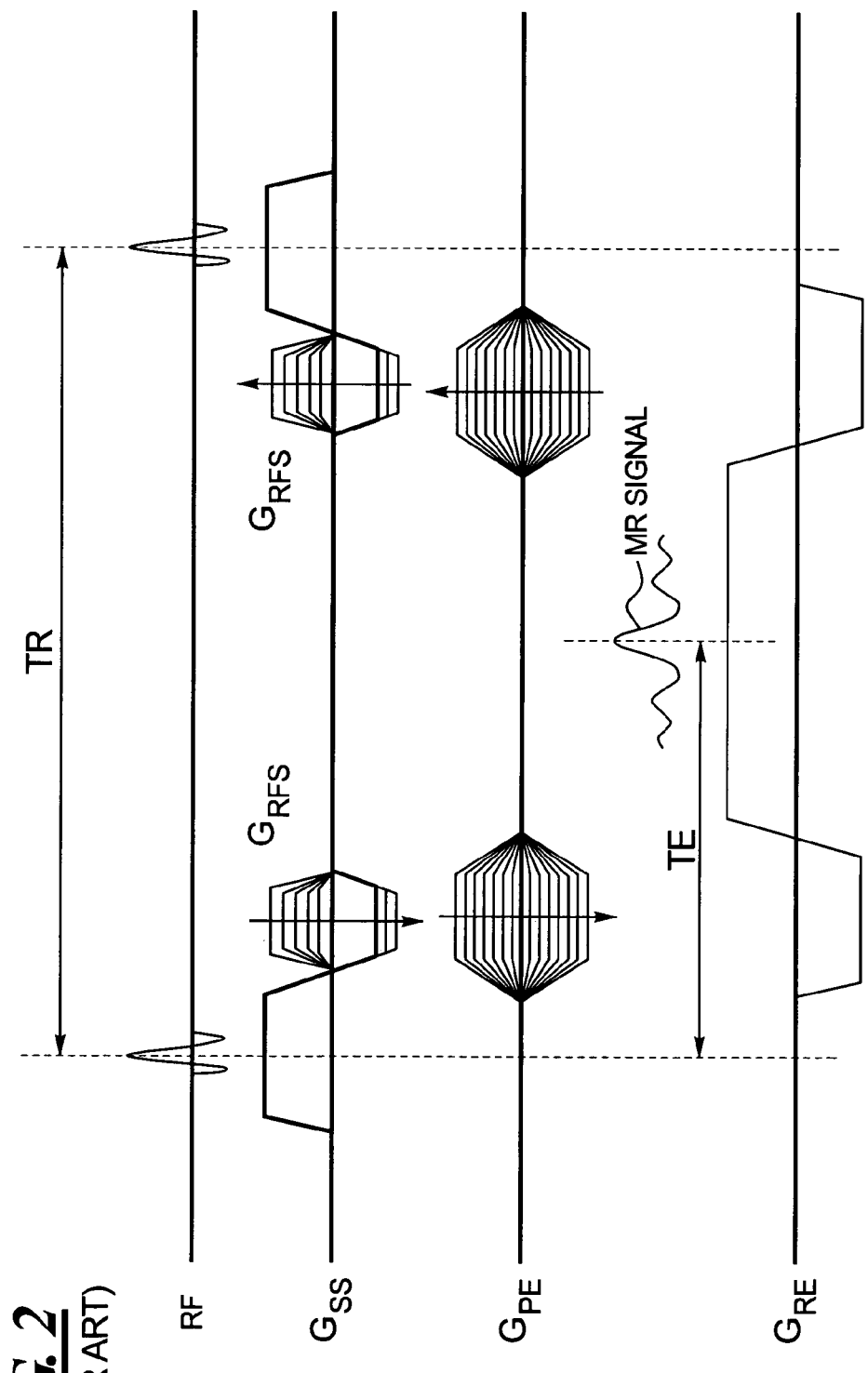
FIG. 2 illustrates conventional trueFISP sequence.

In order to explain the modification of a conventional trueFISP sequence in accordance with the present invention, such a conventional trueFISP sequence is shown in FIG. 2. In this known sequence RF pulses are emitted, separated by a repetition time TR. The RF pulses are made slice-selective by a slice selection gradient $G_{SS}$. A phase encoding gradient $G_{PE}$ is emitted, with stepped amplitudes in alternatingly opposite directions. Readout of the MR signal (echo signal) occurs after the relaxation time TE under a readout gradient $G_{RE}$. The transverse magnetization is refocused following readout by a refocusing gradient $G_{RFS}$, which is stepped in the same direction as the phase encoding gradient $G_{PE}$.

Figure 3:
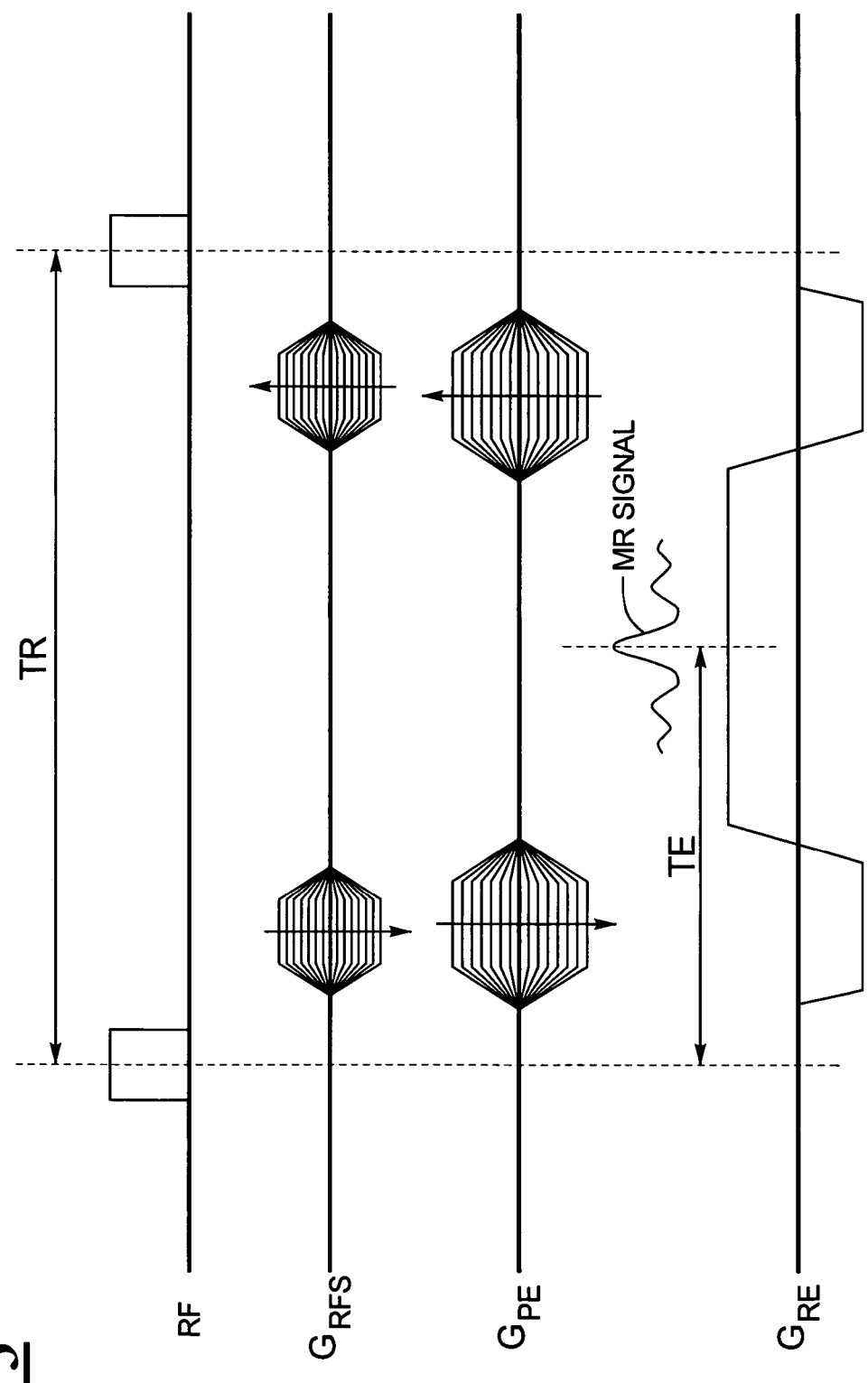
FIG. 3 illustrates a trueFISP sequence modified in accordance with the present invention.

In accordance with the invention, this known sequence is modified as shown in FIG. 3, to employ rectangular RF pulses that are non-slice selective because, as can be seen in FIG. 3, no slice selection gradient $G_{SS}$ is emitted. This non-selective excitation in a trueFISP sequence reduces the repetition time TR, and consequently reduces the effects of field in homogeneities. In addition, such non-selective excitation minimizes the slice profile effects of a slab-selective RF pulse. The non-selective excitation may also help in minimizing the detrimental effects of the out-of-slice contributions produced by flowing blood, which is not maintained in steady state with the slab-selective excitation. Another advantage of non-selective excitation is to reduce the power deposition and consequently the specific absorption rate (SAR). Non-selective rectangular RF pulses have less power deposition than slab-selective pulses sinc pulses for the same flip angle. Therefore, the power deposition can be reduced or flip angle increased concomitantly with a short TR when non-selective excitation is used. This can be of particular benefit at stronger magnetic fields such as 3T.

Figure 4:
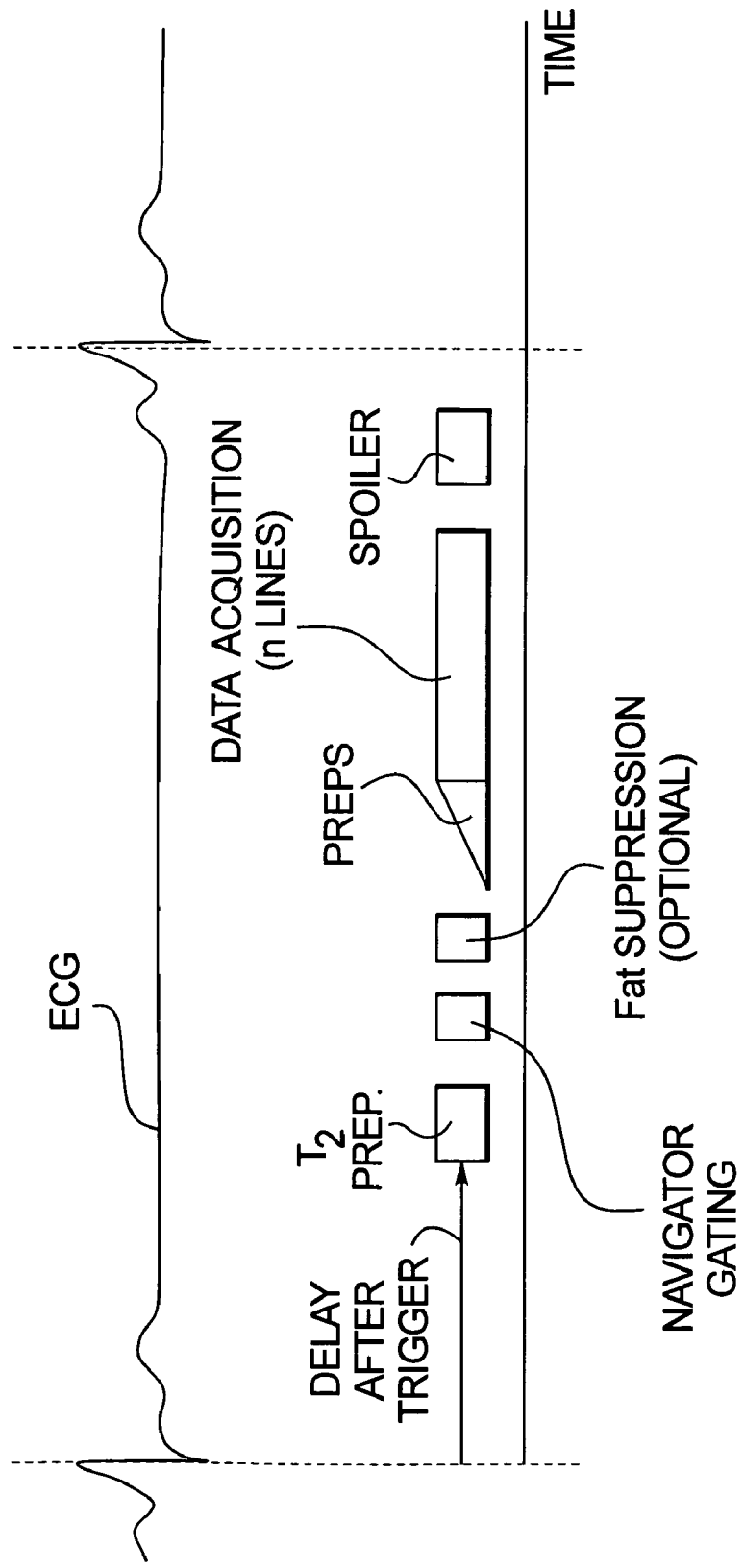
FIG. 4 schematically illustrates the use of the inventive sequence in a procedure for cardiac imaging.

The use of such a modified trueFISP sequence for cardiac imaging is illustrated in FIG. 4, which represents a segmented, three-dimensional trueFISP sequence with non-selective excitation. Non-selective, rectangular RF pulses are used for excitation, with durations long enough to generate 90° flip angles without saturating the transmitter voltage.

The basic sequence structure is a segmented 3D data acquisition in which n phase encoding steps are acquired during each cardiac cycle. The gradients are completely balanced in all three directions during each repetition time TR, and the echo occurs in the middle of the readout period, midway between the consecutive RF pulses. A 180° phase alternation is introduced between consecutive RF pulses to maximize the signal-to-noise ratio of the image and to maintain a relatively uniform signal response to resonance offset angles. Navigator gating is used for free breathing acquisition, and $T_2$ preparation is used to enhance the blood-myocardial contrast.

As can be seen in FIG. 4, the sequence is ECG-triggered, such as by the occurrence of the R-wave. Following a delay, the $T_2$ preparation is undertaken, followed by navigator gating. Fat suppression can be optionally employed. Thereafter, a linear flip angle preparation takes place, followed by data acquisition and a gradient spoiler.

A sequence as shown in FIG. 4 is suitable for imaging cardiac anatomy, and for non-contrast-enhanced magnetic resonance angiography (MRA) of the chest vessels.

Scans were undertaken of five volunteers for anatomic and MRA exams of the chest, using the sequence shown in FIG. 4 with the modified trueFISP sequence of FIG. 3. Due to the non-selective excitation, the imaging volume must encompass the entire body to prevent aliasing artifacts. In such a situation a coronal FOV or sagittal FOV is a more efficient choice to acquire chest images, as opposed an axial FOV. The imaging parameters were as follows: TR/TE=2.3 ms/0.9 ms, flip angle=90°, FOV=400×400 mm$^2$, matrix size=256×256, number of partitions=60 interpolated to 120, number of lines per heartbeat=51, and readout bandwidth=980 Hz/pixel. All of these imaging examinations were undertaken on a Siemens 1.5T AVANTO scanner.

The images acquired in this manner exhibited a signal that was homogenous in the blood pool, and the signal was uniform over the entirety of the 3D slab because there the imperfections that were secondary to the slice profile of the RF pulse were significantly reduced. In general, the images exhibited a uniformity in the blood signal over the relatively large FOV.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance (MR) apparatus to obtain MR image data, comprising the steps of:

emitting a trueFISP MR data acquisition sequence and in said trueFISP MR data acquisition sequence, from a radio frequency resonator, emitting a plurality of only non-selective, rectangular radio frequency excitation pulses into an examination subject that excite nuclear spins in the examination subject;

between successive ones of said radio frequency excitation pulses, emitting a phase encoding magnetic gradient from a gradient coil system in a first direction to encode said examination subject;

also between said successive ones of said radio frequency excitation pulses, emitting a readout magnetic gradient from said gradient coil system in a second direction and, during said readout magnetic gradient, acquiring MR signals produced by said nuclear spins; and also between said successive ones of said radio frequency excitation pulses, emitting a refocusing magnetic gradient from said gradient coil system in each of said first and second directions to refocus transverse magnetization in the examination subject in said first and second directions.

2. A method as claimed in claim 1 comprising:

obtaining an ECG signal from said examination subject encompassing multiple cardiac cycles, and triggering emission of each of said radio frequency excitation pulses, at a same time in each of said cardiac cycles, using said ECG signal; and detecting said magnetic resonance signals with a local radio frequency coil configured for placement relative to the examination subject to acquire said magnetic resonance signals from a region of the examination subject encompassing the heart.

3. A method as claimed in claim 2 comprising, in each cardiac cycle, following a delay after triggering of said radio frequency excitation pulse, emitting a pulse for $T_2$ preparation of said MR signals, preceding emission of said readout gradient.

4. A method as claimed in claim 2 comprising, in each cardiac cycle, emitting a navigator gating pulse sequence after triggering of said radio frequency excitation pulse and before emitting said readout gradient.

5. A method as claimed in claim 2 comprising, in each cardiac cycle, after triggering of said radio frequency excitation pulse and before emitting said readout gradient, emitting a pre-saturation pulse that selectively saturates fat protons in said examination subject so that said fat protons produce a negligible contribution to said magnetic resonance signal.

6. A method as claimed in claim 2 comprising, in each cardiac cycle, after termination of said readout gradient, emitting a spoiler magnetic gradient.

7. A method as claimed in claim 2 comprising, in each cardiac cycle:

after a delay following triggering of said radio frequency excitation pulse, and before emitting said readout gradient, emitting a pulse for $T_2$ preparation of said MR signals;

after said pulse for $T_2$ preparation of said magnetic resonance signal, and before emitting said readout gradient, emitting a navigator gating pulse sequence; and after termination of said readout gradient, emitting a spoiler magnetic gradient.

8. A method as claimed in claim 7 comprising, after emitting said navigator gating pulse sequence, and before emitting said readout gradient, emitting a pre-saturation pulse that selectively saturates fat protons in the examination subject so that said fat protons produce a negligible contribution to said MR signals.

9. A method as claimed in claim 1 comprising emitting at least some of said plurality of non-selective rectangular radio frequency pulses to produce a lower SAR and having an increased flip angle compared to conventional trueFISP radio frequency excitation pulses.

10. A method as claimed in claim 1 comprising acquiring said MR signals by through-plane parallel imaging to reduce a total imaging time.

11. A magnetic resonance (MR) imaging apparatus comprising:

an (MR) scanner configured to receive an examination subject therein, comprising a basic field magnet, a radio frequency resonator, and a gradient coil system; and a computerized control arrangement connected to said MR scanner that operates said MR scanner to emit a trueFISP MR data acquisition sequence and said control arrangement in said trueFISP sequence causing said radio frequency resonator to emit a plurality of only non-selective, rectangular radio frequency excitation pulses into the examination subject that excite nuclear spins in the examination subject, and causing said gradient coil system, between successive ones of said radio frequency excitation pulses, to emit a phase encoding magnetic gradient in a first direction to encode the examination subject and to emit a readout magnetic gradient in a second direction during which magnetic resonance signals produced by said nuclear spins are acquired, and to emit a refocusing magnetic gradient in each of said first and second directions to refocus transverse magnetization in the examination subject in said first and second directions.

12. A magnetic resonance imaging apparatus as claimed in claim 11 comprising:

an ECG unit configured to interact with the examination subject to obtain an ECG signal from the examination subject encompassing multiple cardiac cycles;

said control arrangement being supplied with said ECG signal and triggering emission of each of said radio frequency excitation pulses, at a same time in each of said cardiac cycles, using said ECG signal; and a local radio frequency coil adapted for placement relative to the examination subject to acquire said magnetic resonance signals from a region of the examination subject encompassing the heart.

13. A magnetic resonance imaging apparatus as claimed in claim 12 wherein said control arrangement, in each cardiac cycle, following a delay after triggering of said radio frequency excitation pulse, operates said magnetic resonance scanner to emit a pulse for $T_2$ preparation of said magnetic resonance signals, preceding emission of said readout gradient.

14. A magnetic resonance imaging apparatus as claimed in claim 12 wherein said control arrangement, in each cardiac cycle, operates said magnetic resonance scanner to emit a navigator gating pulse sequence after triggering of said radio frequency excitation pulse and before emitting said readout gradient.

15. A magnetic resonance imaging apparatus as claimed in claim 12 wherein said control arrangement, in each cardiac cycle, after triggering of said radio frequency excitation pulse and before operating said magnetic resonance scanner to emit said readout gradient, operates said magnetic resonance scanner to emit a pre-saturation pulse that selectively saturates fat protons in the examination subject so that said fat protons produce a negligible contribution to said magnetic resonance signal.

16. A magnetic resonance imaging apparatus as claimed in claim 12 wherein said control arrangement, in each cardiac cycle, after termination of said readout gradient, operates said magnetic resonance scanner to emit a spoiler magnetic gradient.

17. A magnetic resonance imaging apparatus as claimed in claim 12 wherein said control arrangement, in each cardiac cycle, after a delay following triggering of said radio frequency excitation pulse, and before operating said magnetic resonance scanner to emit said readout gradient, operates said magnetic resonance scanner to emit a pulse for $T_2$ preparation of said magnetic resonance signals, and after said pulse for $T_2$ preparation of said magnetic resonance signal, and before emitting said readout gradient, to emit a pulse sequence for navigator gating, and after termination of said readout gradient, to emit a spoiler magnetic gradient.

18. A magnetic resonance imaging apparatus as claimed in claim 17 wherein said control arrangement, after emitting said navigator pulse sequence, and before operating said magnetic resonance scanner to emit said readout gradient, operates magnetic resonance scanner to emit a pre-saturation pulse that selectively saturates fat protons in the examination subject so that said fat protons produce a negligible contribution to said magnetic resonance signal.

* * * * *